United States Patent
Kotani et al.

(10) Patent No.: US 10,600,901 B2
(45) Date of Patent: Mar. 24, 2020

(54) COMPOUND SEMICONDUCTOR DEVICE AND MANUFACTURING METHOD THEREOF

(71) Applicant: FUJITSU LIMITED, Kawasaki-shi, Kanagawa (JP)

(72) Inventors: Junji Kotani, Atsugi (JP); Norikazu Nakamura, Sagamihara (JP); Tetsuro Ishiguro, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/168,623

(22) Filed: May 31, 2016

(65) Prior Publication Data

US 2016/0359032 A1 Dec. 8, 2016

(30) Foreign Application Priority Data

Jun. 3, 2015 (JP) ................................ 2015-113509

(51) Int. Cl.
*H01L 29/20* (2006.01)
*H01L 29/205* (2006.01)
(Continued)

(52) U.S. Cl.
CPC ...... *H01L 29/7787* (2013.01); *H01L 21/0254* (2013.01); *H01L 21/0262* (2013.01); *H01L 21/02458* (2013.01); *H01L 21/02576* (2013.01); *H01L 29/432* (2013.01); *H01L 29/66462* (2013.01); *H01L 29/7786* (2013.01); *H03F 1/3247* (2013.01); *H01L 29/201* (2013.01); *H01L 29/2003* (2013.01); *H01L 29/517* (2013.01); *H02M 3/28* (2013.01)

(58) Field of Classification Search
CPC ............ H01L 29/7787; H01L 29/7786; H01L 29/2003; H01L 29/205; H01L 21/02458; H01L 21/0254; H01L 21/02576; H01L 21/0262
See application file for complete search history.

(56) References Cited

U.S. PATENT DOCUMENTS 6,316,793 B1 * 11/2001 Sheppard ............ H01L 29/1608
257/103
2002/0017696 A1 2/2002 Nakayama et al.
(Continued)

FOREIGN PATENT DOCUMENTS

JP 2002-016087 1/2002
JP 2003-229439 8/2003
(Continued)

OTHER PUBLICATIONS

JPOA—Office Action of Japanese Patent Application No. 2015-113509 dated Dec. 18, 2018, with English translation.
(Continued)

*Primary Examiner* — Tucker J Wright
*Assistant Examiner* — Scott Stowe
(74) *Attorney, Agent, or Firm* — Fujitsu Patent Center

(57) ABSTRACT

A compound semiconductor device includes: a carrier transit layer; a carrier supply layer that is formed over the carrier transit layer and is made of InAlN; and a spacer layer that is formed between the carrier transit layer and the carrier supply layer and is made of at least one of AlGaN and InAlGaN.

6 Claims, 12 Drawing Sheets

(51) Int. Cl.
    *H01L 29/778*     (2006.01)
    *H01L 21/02*     (2006.01)
    *H01L 29/66*     (2006.01)
    *H01L 29/43*     (2006.01)
    *H03F 1/32*     (2006.01)
    *H01L 29/51*     (2006.01)
    *H01L 29/201*     (2006.01)
    *H02M 3/28*     (2006.01)

(56) References Cited

U.S. PATENT DOCUMENTS

| | | |
|---|---|---|
| 2007/0295990 A1 | 12/2007 | Higashiwaki |
| 2011/0024795 A1 | 2/2011 | Miyoshi et al. |
| 2013/0075751 A1* | 3/2013 | Imanishi ........... H01L 29/66462 257/76 |
| 2014/0091320 A1* | 4/2014 | Nakamura ........ H01L 29/66462 257/76 |
| 2014/0091364 A1 | 4/2014 | Imanishi et al. |
| 2014/0361308 A1* | 12/2014 | Yui .................... H01L 21/0254 257/76 |
| 2015/0357420 A1 | 12/2015 | Endoh |
| 2016/0293596 A1* | 10/2016 | Fareed ............... H01L 27/0883 |

FOREIGN PATENT DOCUMENTS

| | | |
|---|---|---|
| JP | 2005-268493 | 9/2005 |
| JP | 2011-138807 | 7/2011 |
| JP | 2013-077638 | 4/2013 |
| JP | 2014-072397 | 4/2014 |
| WO | 2006/022453 A1 | 3/2006 |
| WO | 2009/119357 A1 | 10/2009 |
| WO | 2014/147706 A1 | 9/2014 |

OTHER PUBLICATIONS

JPOA—Office Action of Japanese Patent Application No. 2015-113509 dated May 28, 2019, with full English translation of the Office Action.

\* cited by examiner

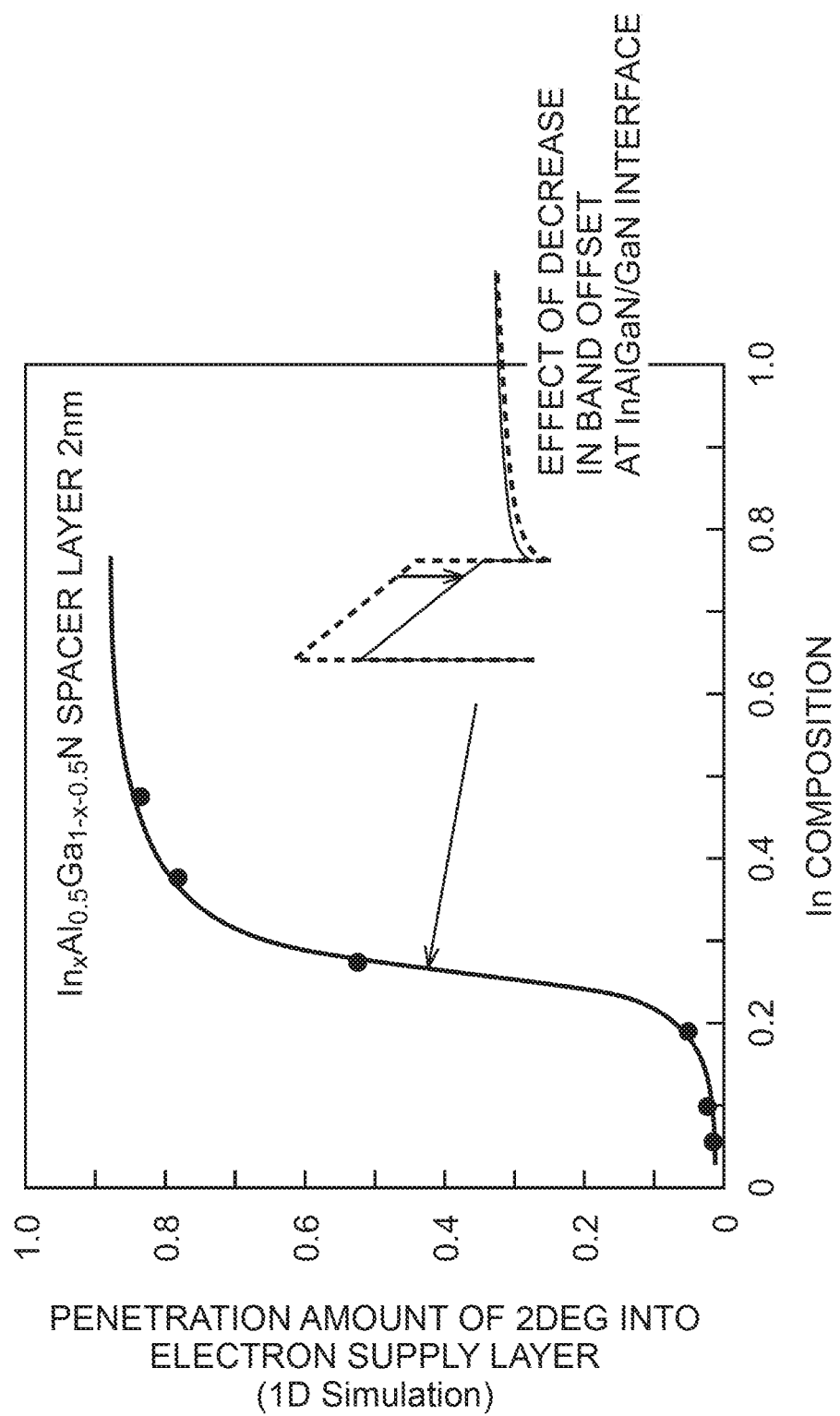

COMPOUND SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2015-113509, filed on Jun. 3, 2015, the entire contents of which are incorporated herein by reference.

FIELD

The embodiments discussed herein are directed to a compound semiconductor device and a manufacturing method thereof.

BACKGROUND

There is considered application of a nitride semiconductor to a semiconductor device with high withstand voltage and high output power, utilizing characteristics such as high saturation electron speed and wide band gap. For example, the band gap of GaN as the nitride semiconductor is 3.4 eV, which is larger than the band gap of Si (1.1 eV) and the band gap of GaAs (1.4 eV), and thus GaN has high breakdown electric field intensity. Accordingly, GaN is quite promising as a material of a semiconductor device for power supply that obtains high voltage operation and high output power.

As a semiconductor device using the nitride semiconductor, there have been made numerous reports on a field effect transistor, particularly a high electron mobility transistor (HEMT). For example, among GaN-based HEMTs (GaN-HEMTs), an AlGaN/GaN.HEMT using GaN as an electron transit layer and using AlGaN as an electron supply layer is attracting attention. In the AlGaN/GaN.HEMT, a strain resulted from a lattice constant difference between GaN and AlGaN occurs in AlGaN. Two-dimensional electron gas (2DEG) of high concentration is obtained from piezoelectric polarization caused by the strain and spontaneous polarization of AlGaN. Accordingly, the AlGaN/GaN.HEMT is expected as a high efficiency switch element and a high-withstand-voltage electric power device for electric vehicle, or the like.

Patent Document 1: Japanese Laid-open Patent Publication No. 2002-16087
Patent Document 2: Japanese Laid-open Patent Publication No. 2013-77638
Patent Document 3: Japanese Laid-open Patent Publication No. 2003-229439

SUMMARY

One aspect of a compound semiconductor device includes: a carrier transit layer; a carrier supply layer that is formed over the carrier transit layer and is made of InAlN; and a spacer layer that is formed between the carrier transit layer and the carrier supply layer and is made of at least one of AlGaN and InAlGaN.

One aspect of a manufacturing method of a compound semiconductor device includes: forming a carrier transit layer; forming, on the carrier transit layer, a spacer layer made of at least one of AlGaN and InAlGaN; and forming, on the spacer layer, a carrier supply layer made of InAlN.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a characteristics diagram illustrating dependence on an In composition regarding a penetration amount of 2DEG into an electron supply layer in the case when a spacer layer of InAlGaN according to the second embodiment is used;

DESCRIPTION OF EMBODIMENTS

First Embodiment

In order to improve operating efficiency of a nitride semiconductor transistor, on-resistance during on-operation is preferable to be reduced as much as possible. In order to achieve this, access resistance between a source electrode and a gate electrode and access resistance between a gate electrode and a drain electrode is preferable to be reduced. In order to achieve this, it is preferable to satisfy both a high 2DEG concentration and high electron (2DEG) mobility.

InAlN being one of nitride semiconductor materials has a large difference in spontaneous polarization from GaN and is able to achieve a high 2DEG concentration. In this case, InAlN is used for an electron supply layer and between an electron transit layer of GaN and the electron supply layer of InAlN, a spacer layer of AlN is interposed, thereby making it possible to avoid a significant decrease in 2DEG mobility.

However, AlN, when growing, bonds to N existing nearby because of high activity of an Al atom, resulting in formation of pits on a surface. Therefore, the spacer layer of AlN has a low surface smoothness, which can be a cause of interface roughness scattering. As a result, it becomes difficult to achieve high 2DEG mobility, which is the original role of the spacer layer.

Further, in an interface between the electron transit layer of GaN and the spacer layer of AlN, a very strong stress is internally contained. This is because the interface is a bonded interface of materials, which are GaN and AlN. GaN and AlN are greatly different in lattice constant, resulting in that a crystal defect is likely to be induced at the interface. This crystal defect causes a decrease in 2DEG mobility.

This embodiment discloses an InAlN/GaN.HEMT of a nitride semiconductor as a compound semiconductor device.

Figure 1A:
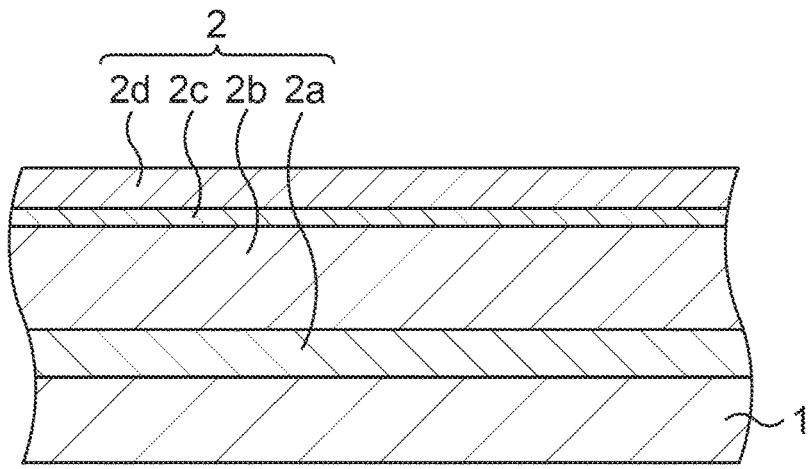
FIG. 1A to FIG. 1C are schematic cross-sectional views each illustrating a manufacturing method of an InAlN/GaN.HEMT according to a first embodiment in order of processes.
Figure 1B:
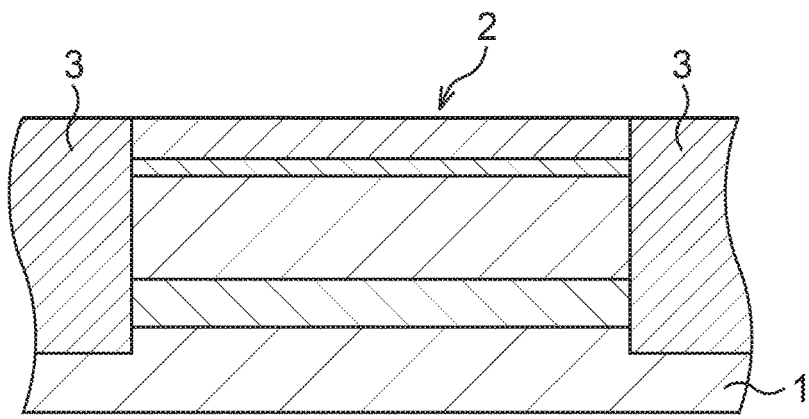
Figure 1C:
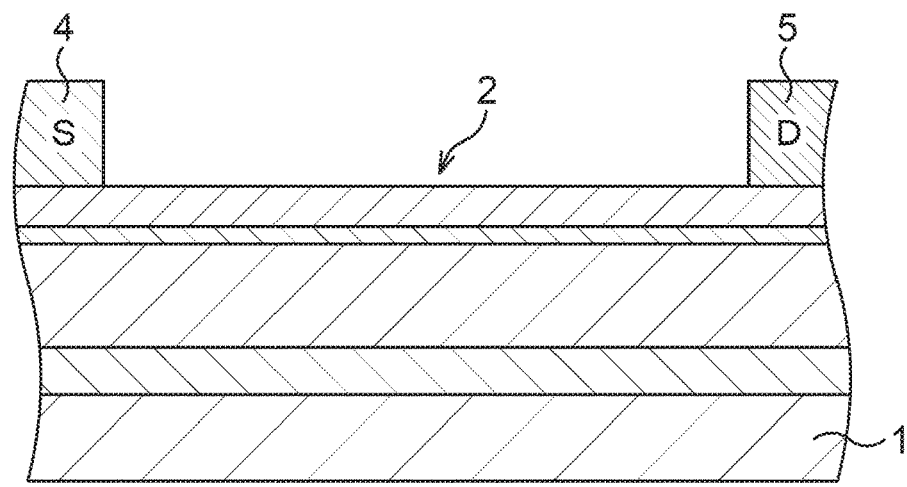
Figure 2:
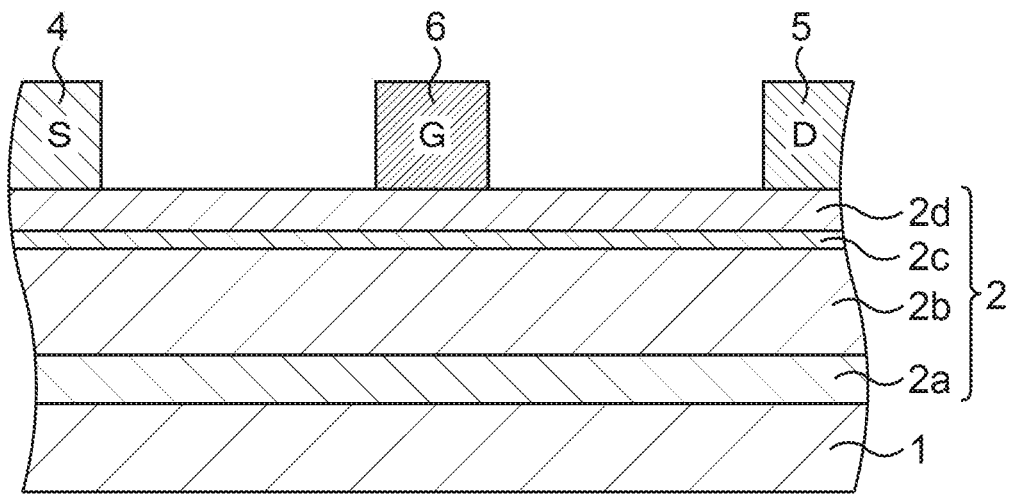
FIG. 2 is a schematic cross-sectional view, subsequent to FIG. 1A and FIG. 1B, illustrating the manufacturing method of the InAlN/GaN.HEMT according to the first embodiment in order of processes.

FIG. 1A to FIG. 2 are schematic cross-sectional views each illustrating a manufacturing method of an InAlN/GaN.HEMT according to a first embodiment in order of processes.

First, as illustrated in FIG. 1A, a compound semiconductor stacked structure 2 is formed on, for example, an Si substrate 1 as a growth substrate. As the growth substrate, an SiC substrate, a sapphire substrate, a GaAs substrate, a GaN substrate, or the like may also be used in place of the Si substrate. Further, the conductivity of the substrate may be either semi-insulating or insulating.

The compound semiconductor stacked structure 2 is made up by including a buffer layer 2a, an electron transit layer 2b, a spacer layer 2c, and an electron supply layer 2d. In this embodiment, a carrier is an electron (2DEG), so that a carrier transit layer results in the electron transit layer 2b, and a carrier supply layer results in the electron supply layer 2d.

In the completed InAlN/GaN.HEMT, two-dimensional electron gas (2DEG) is generated in the vicinity of an interface of the electron transit layer 2b with the electron supply layer 2d (accurately, the spacer layer 2c) at the time of its operation. This 2DEG is generated based on a difference in lattice constant between a compound semiconductor (here, GaN) of the electron transit layer 2b and a compound semiconductor (here, InAlN) of the electron supply layer 2d.

More specifically, each compound semiconductor below is grown by, for example, a metal organic vapor phase epitaxy (MOVPE) method on the Si substrate 1. A molecular beam epitaxy (MBE) method or the like may also be used in place of the MOVPE method.

AlN is grown to have a thickness of 160 nm or so on the Si substrate 1 as an initial layer (not illustrated). Thereafter, AlGaN is grown to have a thickness of 200 nm or so, i (intentionally undoped)-GaN is grown to have a thickness of 1 μm or so, AlGaN is grown to have a thickness of 20 nm or so, InAlN is grown to have a thickness of 10 nm or so, and n-GaN is grown to have a thickness of 3 nm or so sequentially. Thereby, the buffer layer 2a, the electron transit layer 2b, the spacer layer 2c, and the electron supply layer 2d are formed on the initial layer. On the electron supply layer 2d, an n-GaN cap layer may also be formed.

In this embodiment, as the spacer layer 2c, AlGaN is formed, and as the electron supply layer 2d, InAlN is formed. AlGaN of the spacer layer 2c is set to $Al_xGa_{1-x}N$, and a composition ratio of Al is not less than 0.2 nor more than 0.7 ($0.2 \leq x \leq 0.7$), and is set to, for example, 0.5 or so ($Al_{0.5}Ga_{0.5}N$). This composition ratio range will be described later. As for InAlN of the electron supply layer 2d, for example, a composition ratio of In is set to 0.17 and a composition ratio of Al is set to 0.83 ($In_{0.17}Al_{0.83}N$).

AlGaN of the spacer layer 2c is formed to have a thickness of 2 nm or so to 3 nm or so. When the thickness of the spacer layer 2c falls below 2 nm or so, it becomes impossible to ignore penetration of electrons into the electron supply layer 2d, resulting in that occurrence of alloy scattering is concerned. When the above thickness exceeds 3 nm or so, the distance between a gate electrode and the 2DEG increases, resulting in that a short-channel effect is concerned. The spacer layer 2c is formed to have a thickness of 2 nm or so to 3 nm or so, thereby making it possible to suppress not only the penetration of electrons into the electron supply layer 2d but also the short-channel effect.

A growth condition of AlN is that a mixed gas of a trimethylaluminum (TMA) gas and an ammonia ($NH_3$) gas is used as a source gas. A growth condition of GaN is that a mixed gas of a trimethylgallium (TMG) gas and an $NH_3$ gas is used as a source gas. A growth condition of AlGaN is that a mixed gas of a TMA gas, a TMG gas, and an $NH_3$ gas is used as a source gas. A growth condition of InAlN is that a mixed gas of a trimethylindium (TMI) gas, a TMA gas, and an $NH_3$ gas is used as a source gas. Presence and absence of supplies and flow rates of the TMA gas being an Al source, the TMG gas being a Ga source, and the TMI gas being an In source are appropriately set in accordance with compound semiconductor layers to be grown. A flow rate of the $NH_3$ gas being a common source is set to 100 ccm or so to 10 LM or so. Besides, a growth pressure is set to 50 Torr or so to 300 Torr or so, and a growth temperature is set to 1000° C. or so to 1200° C. or so. The growth condition of InAlN is that a growth pressure is set to 50 Torr or so to 300 Torr or so and a growth temperature is set to 650° C. or so to 800° C. or so.

When GaN and AlGaN are each grown as an n-type, for example, an $SiH_4$ gas containing as an n-type impurity, for example, Si is added to the source gas at a predetermined flow rate to dope Si into GaN and AlGaN. A doping concentration of Si is $1 \times 10^{18}/cm^3$ or so to $1 \times 10^{20}/cm^3$ or so, and is set to $5 \times 10^{18}/cm^3$ or so, for example.

Subsequently, as illustrated in FIG. 1B, element isolation structures 3 are formed. In and after FIG. 2A, the illustration of the element isolation structures 3 is omitted.

More specifically, for example, argon (Ar) is injected into element isolation regions of the compound semiconductor stacked structure 2. The element isolation structures 3 are thereby formed in the compound semiconductor stacked structure 2 and a surface layer portion of the Si substrate 1. Active regions are defined on the compound semiconductor stacked structure 2 by the element isolation structures 3.

Note that the element isolation may also be performed by using, for example, a STI (Shallow Trench Isolation) method in place of the above-described injection method. At this time, for example, a chlorine-based etching gas is used for dry-etching of the compound semiconductor stacked structure 2.

Subsequently, as illustrated in FIG. 1C, a source electrode 4 and a drain electrode 5 are formed.

More specifically, a resist mask for forming the source electrode and the drain electrode is first formed. Here, for example, an eaves-structure two-layer resist suitable for a vapor deposition method and a lift-off method is used. This resist is applied on the compound semiconductor stacked structure 2 to form openings that expose planned electrode formation positions on the compound semiconductor stacked structure 2. Thereby, the resist mask having the openings is formed.

With the use of this resist mask, as an electrode material, for example, Ta (upper layer)/Al (lower layer) are deposited on the resist mask including the insides of the openings that expose the planned electrode formation positions by the vapor deposition method, for example. The thickness of Ta is set to 20 nm or so, and the thickness of Al is set to 200 nm or so. By the lift-off method, the resist mask and Ta/Al deposited thereon are removed. Thereafter, the Si substrate 1 is heat treated at a temperature of 400° C. to 1000° C. or so, for example, 600° C. or so in a nitrogen atmosphere, for example, and remaining Ta/Al are brought into ohmic contact with the electron supply layer 2d. As long as the ohmic contact of Ta/Al with the electron supply layer 2d can be obtained, there is sometimes a case that the heat treatment is unnecessary. Thereby, the source electrode 4 and the drain electrode 5 are formed on the compound semiconductor stacked structure 2.

Incidentally, it is also possible that recesses are formed at the planned electrode formation positions of the compound semiconductor stacked structure 2 and the source electrode and the drain electrode are formed so as to embed the electrode materials in the recesses.

Subsequently, as illustrated in FIG. 2, a gate electrode 6 is formed.

More specifically, a resist mask for forming the gate electrode is first formed. Here, for example, an eaves-structure two-layer resist suitable for the vapor deposition method and the lift-off method is used. This resist is applied on the compound semiconductor stacked structure 2 to form an opening that exposes a planned electrode formation position on the compound semiconductor stacked structure 2. Thereby, the resist mask having the opening is formed.

With the use of this resist mask, as an electrode material, for example, Ni (upper layer)/Au (lower layer) are deposited on the resist mask including the inside of the opening that exposes the planned electrode formation position by the vapor deposition method, for example. The thickness of Ni is set to 30 nm or so, and the thickness of Au is set to 400 nm or so. By the lift-off method, the resist mask and Ni/Au deposited thereon are removed. Thereby, the gate electrode 6 is formed on the compound semiconductor stacked structure 2.

Figure 3:
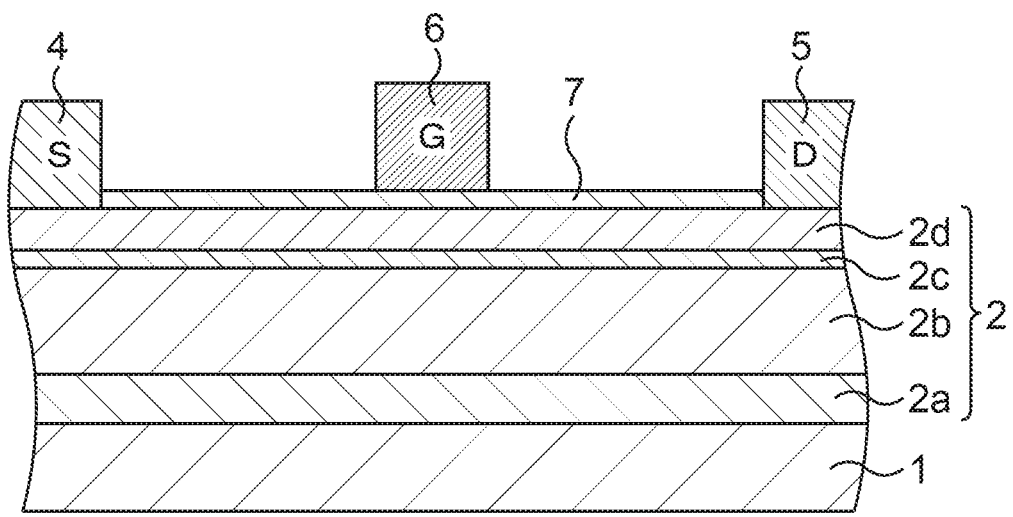
FIG. 3 is a schematic cross-sectional view illustrating another example of the InAlN/GaN.HEMT according to the first embodiment.

In this embodiment, there has been described as an example the Schottky-type InAlN/GaN.HEMT in which the gate electrode 6 directly comes into contact with the compound semiconductor stacked structure 2. In place of the Schottky type, an MIS-type InAlN/GaN.HEMT that includes a gate insulating film between a compound semiconductor stacked structure 2 and a gate electrode 6 may also be fabricated. One example of this case is illustrated in FIG. 3. As the gate insulating film 7, for example, $Al_2O_3$ as an insulating material is deposited on the compound semiconductor stacked structure 2 so as to cover the surface of the compound semiconductor stacked structure 2. $Al_2O_3$ is deposited to have a thickness of 2 nm to 200 nm or so, here 10 nm or so by an atomic layer deposition method (ALD method), for example. Incidentally, the deposition of $Al_2O_3$ may also be performed by, for example, a plasma CVD method, a sputtering method, or the like in place of the ALD method. Further, in place of the deposition of $Al_2O_3$, a nitride or an oxynitride of Al may be used. Besides, an oxide, a nitride or an oxynitride of Si, Hf, Zr, Ti, Ta, or W, or a multilayer of ones appropriately selected from among these may also be deposited to form a gate insulating film.

Further, it is also possible that a recess is formed at the planned electrode formation position of the compound semiconductor stacked structure 2 and the gate electrode is formed so as to embed the electrode materials in the recess.

Thereafter, through processes such as forming an interlayer insulating film, forming wirings connected to the source electrode 4, the drain electrode 5, and the gate electrode 6, forming an upper protective film, forming a connection electrode exposed on the uppermost surface and so on, the InAlN/GaN.HEMT according to this embodiment is formed.

Hereinafter, there will be explained operations and effects exhibited by the InAlN/GaN.HEMT according to this embodiment.

In this embodiment, in the compound semiconductor stacked structure 2, the spacer layer 2c is formed of AlGaN and the electron supply layer 2d is formed of InAlN.

The electron supply layer 2d is formed of InAlN, to thereby create a large difference in spontaneous polarization from GaN of the electron transit layer 2b, resulting in that a high 2DEG concentration can be achieved.

Figure 4A:
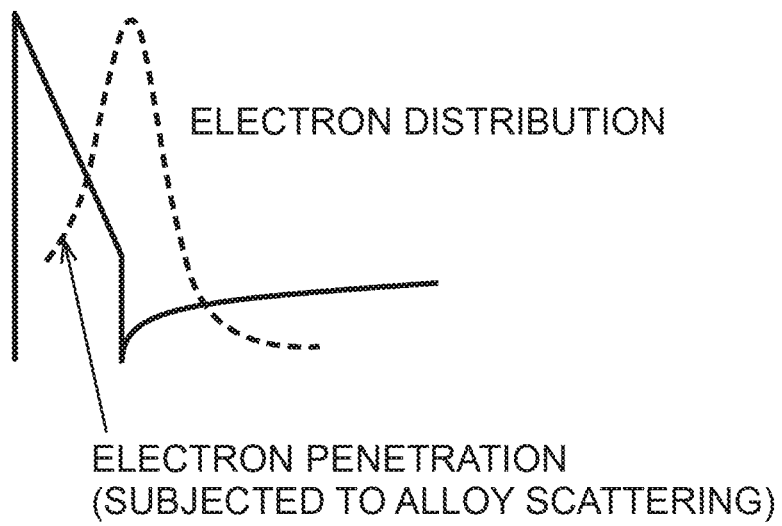
FIG. 4A and FIG. 4B are characteristic diagrams illustrating electron distribution in the case when a spacer layer of AlN is formed between an electron transit layer of GaN and an electron supply layer of InAlN based on comparison with the case when the spacer layer is not formed.
Figure 4B:
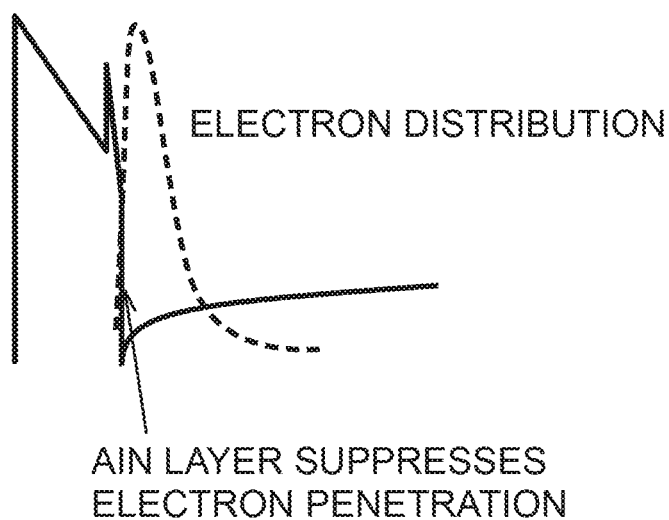

FIG. 4A and FIG. 4B are characteristic diagrams illustrating electron distribution in the case when a spacer layer of AlN is formed between the electron transit layer of GaN and the electron supply layer of InAlN based on comparison with the case when the spacer layer is not formed. FIG. 4A illustrates the case when the spacer layer of AlN is formed, and FIG. 4B illustrates the case when it is not formed respectively. Like FIG. 4A, by interposing the spacer layer of AlN, a band offset amount at the interface with the electron transit layer increases, and such penetration of 2DEG into the electron supply layer side as in FIG. 4B is suppressed. Thereby, the 2DEG is not easily subjected to alloy scattering by the electron supply layer and high 2DEG mobility is achieved.

However, when AlN of the spacer layer is grown, Al atoms are very active, resulting in difficulty in growing of AlN having high smoothness. When the smoothness of the interface of the surface of the spacer layer with the electron supply layer is poor, the poor smoothness causes surface and interface roughness scatterings to the 2DEG, resulting in that it becomes difficult to achieve high mobility, which is the original role of the spacer layer. Further, in the interface of the spacer layer with the electron transit layer, a very strong stress is internally contained. This is because the interface is a bonded interface of materials, which are AlN and GaN, having a composition of a pole opposite to AlGaN, and the both are greatly different in lattice constant, resulting in that a crystal defect is likely to be induced at the interface. Further, this defect causes a decrease in the 2DEG mobility.

The spacer layer 2c according to this embodiment is made of AlGaN whose lattice constant is larger than AlN and is close to GaN. Thereby, the stress in the interface of the spacer layer 2c with the electron transit layer 2b is alleviated, defect occurrence at the interface is suppressed, and the electron (2DEG) mobility improves.

Figure 5:
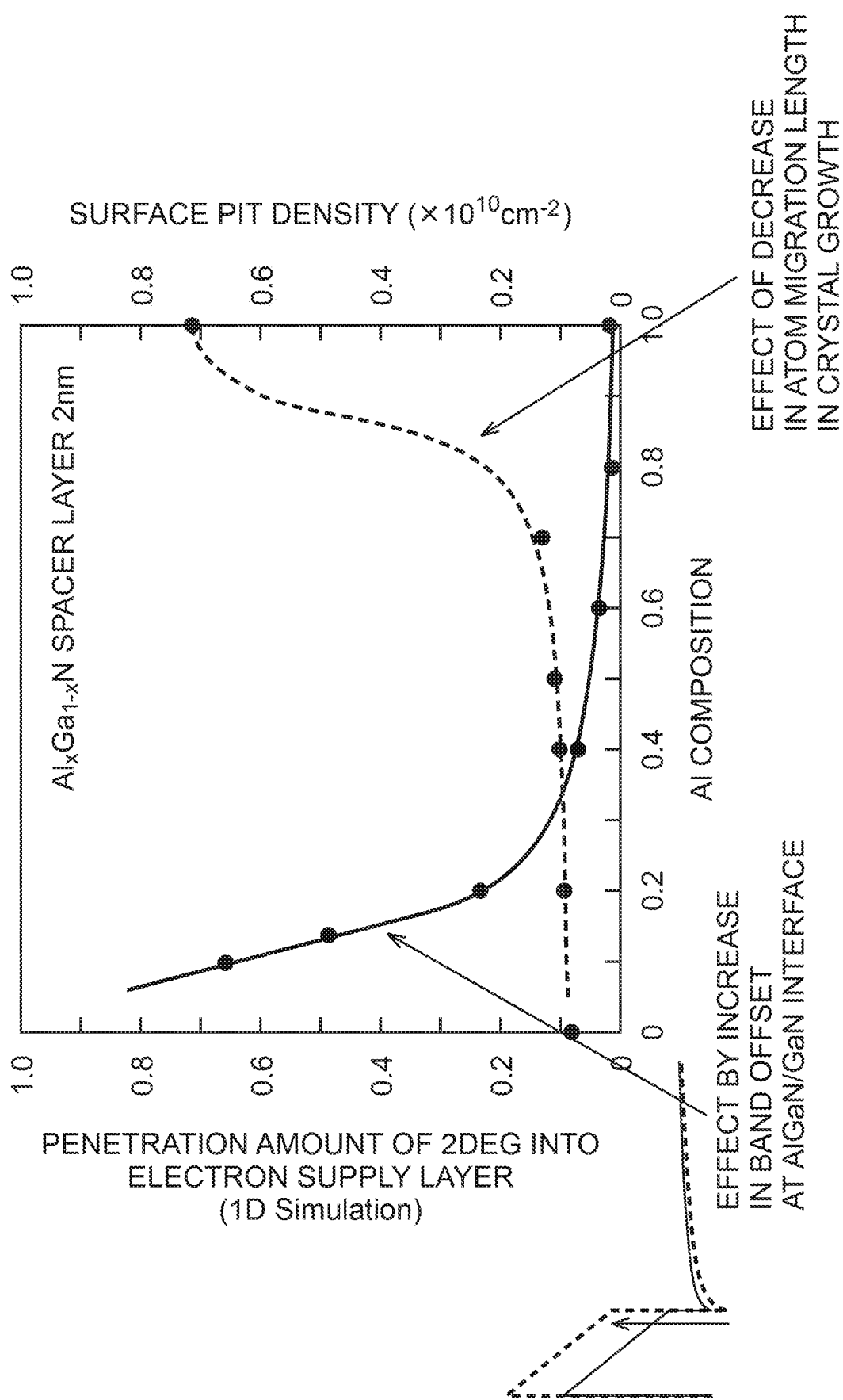
FIG. 5 is a characteristics diagram illustrating dependence on an Al composition regarding a penetration amount of 2DEG into an electron supply layer and surface smoothness (pit density) in the case when a spacer layer of AlGaN according to the first embodiment is used.

FIG. 5 is a characteristic diagram illustrating dependence on an Al composition regarding a penetration amount of 2DEG into the electron supply layer and surface smoothness (pit density) in the case when the spacer layer of AlGaN according to this embodiment is used. The penetration amount of 2DEG into the electron supply layer $2d$ is calculated based on one-dimensional band calculation. First, the penetration amount tends to decrease monotonously as the Al composition becomes higher. This is because the band offset amount at the interface of the spacer layer $2c$ with GaN (electron transit layer $2b$) increases with the Al composition. As long as the Al composition is 0.2 or more, the penetration of 2DEG into the electron supply layer $2d$ is suppressed and the 2DEG is not easily subjected to alloy scattering by the electron supply layer, resulting in that the electron (2DEG) mobility improves. On the other hand, as for the surface smoothness, since the Al atoms are active as described above, the surface smoothness tends to deteriorate as the Al composition increases. The spacer layer $2c$ of this embodiment is made of AlGaN and by the addition of Ga, lateral overgrowth is promoted, so that as long as the Al composition is 0.7 or less, the spacer layer $2c$ exhibits high surface smoothness. Due to the high surface smoothness, the surface roughness scattering is suppressed and the electron (2DEG) mobility improves. Therefore, as long as the Al composition of the spacer layer $2c$ of AlGaN falls within a range of not less than 0.2 nor more than 0.7, an excellent electron confinement property and high surface smoothness are both satisfied to contribute to a further improvement in the electron (2DEG) mobility.

As has been explained above, in this embodiment, there is fabricated the InAlN/GaN.HEMT that satisfies both a high 2DEG concentration and high electron (2DEG) mobility and has high operating efficiency. The high electron mobility is achieved by suppressing alloy scattering, reducing crystal defects at the interface of the spacer layer $2c$ with the electron transit layer $2b$, improving surface smoothness of the spacer layer $2c$ and the like.

Second Embodiment

This embodiment discloses a structure and a manufacturing method of an InAlN/GaN.HEMT similarly to the first embodiment, but is different from the first embodiment in that the spacer layer is different. Note that the same constituent members and so on as those in the first embodiment will be denoted by the same reference signs, and detailed explanations thereof will be omitted.

Figure 6A:
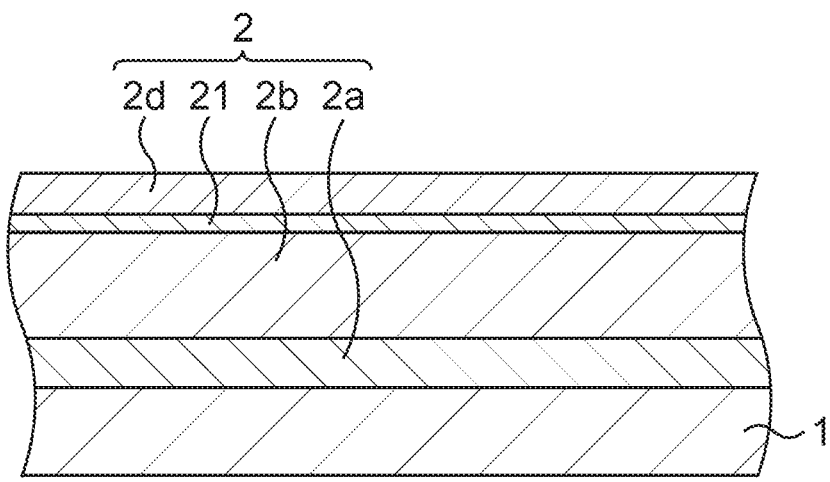
FIG. 6A and FIG. 6B are schematic cross-sectional views each illustrating a principal process of a manufacturing method of an InAlN/GaN.HEMT according to a second embodiment.
Figure 6B:
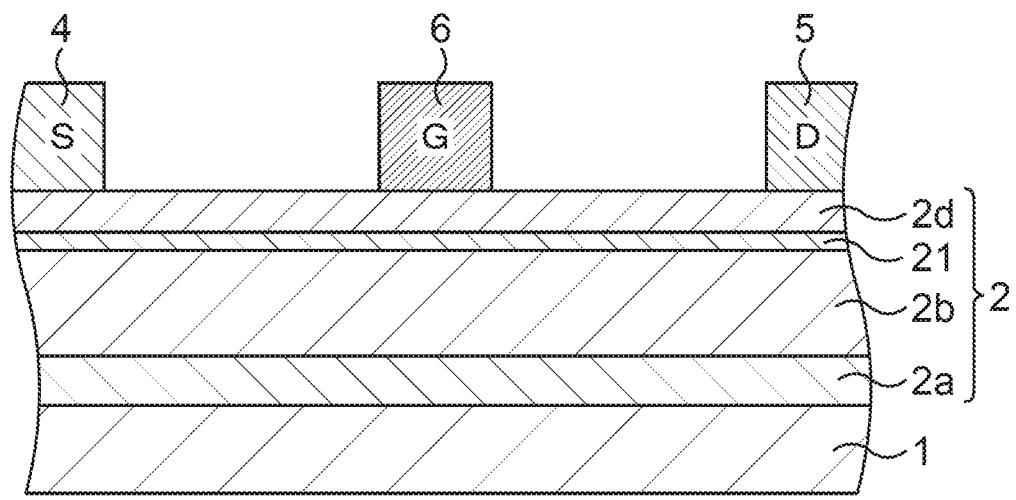

FIG. 6A and FIG. 6B are schematic cross-sectional views each illustrating a principal process of the manufacturing method of the InAlN/GaN.HEMT according to a second embodiment.

In this embodiment, as illustrated in FIG. 6A, the compound semiconductor stacked structure 2 is first formed similarly to the first embodiment, but in place of the spacer layer $2c$ of AlGaN, a spacer layer 21 is formed. The spacer layer 21 is formed by growing InAlGaN on i-GaN of the electron transit layer $2b$. A growth condition of InAlGaN is that as a source gas, a mixed gas of a TMI gas, a TMA gas, a TMG gas, and an $NH_3$ gas is used. InAlGaN of the spacer layer 21 is formed to have a thickness of 2 nm or so to 3 nm or so similarly to AlGaN of the spacer layer $2c$.

InAlGaN of the spacer layer 21 is set to $In_xAl_yGa_{1-x-y}N$, and a composition ratio of In is 0.2 or less ($0<x\leq0.2$), for example, 0.05 or so, and a composition ratio of Al is not less than 0.2 nor more than 0.7 ($0.2\leq y\leq 0.7$) ($In_{0.05}Al_{0.5}Ga_{0.45}N$). This composition ratio range will be described later.

Subsequently, the various processes in FIG. 1B to FIG. 2 are gone through. At this time, as illustrated in FIG. 6B, the source electrode 4, the drain electrode 5, and the gate electrode 6 are formed on the compound semiconductor stacked structure 2.

Thereafter, through processes such as forming an interlayer insulating film, forming wirings connected to the source electrode 4, the drain electrode 5, and the gate electrode 6, forming an upper protective film, forming a connection electrode exposed on the uppermost surface and so on, the InAlN/GaN.HEMT according to this embodiment is formed.

Hereinafter, there will be explained operations and effects exhibited by the InAlN/GaN.HEMT according to this embodiment.

Similarly to the first embodiment, the electron supply layer $2d$ is formed of InAlN, to thereby create a large difference in spontaneous polarization from GaN of the electron transit layer $2b$, resulting in that a high 2DEG concentration can be achieved.

The spacer layer 21 according to this embodiment is made of InAlGaN whose lattice constant is larger than AlN and is closer to GaN. Thereby, the stress in the interface of the spacer layer 21 with the electron transit layer $2b$ is further decreased, defect occurrence at the interface is suppressed, and the electron (2DEG) mobility improves.

FIG. 7 is a characteristic diagram illustrating dependence on an In composition regarding a penetration amount of 2DEG into the electron supply layer in the case when the spacer layer of InAlGaN according to this embodiment is used. The penetration amount of 2DEG into the electron supply layer $2d$ is calculated based on one-dimensional band calculation. In the spacer layer 21, an amount of distortion internally contained in the spacer layer 21 is decreased as the concentration of In is higher. On the other hand, by the addition of In, energy Ec at a band gap, particularly, a lower end of a conduction band decreases and the penetration amount of 2DEG into the electron supply layer $2d$ increases. That is, in this case, a tradeoff exists between the decrease in the amount of distortion internally contained in the spacer layer 21 and the increase in the penetration amount of 2DEG into the electron supply layer $2d$. As illustrated in FIG. 7, in the spacer layer 21, when the In composition exceeds 0.2, the penetration amount increases drastically. This indicates that alloy scattering occurs hard simultaneously. Therefore, as long as the In composition of the spacer layer 21 of InAlGaN is 0.2 or less, occurrence of alloy scattering is suppressed to contribute to a further improvement in the electron (2DEG) mobility.

As has been explained above, in this embodiment, there is fabricated the InAlN/GaN.HEMT that satisfies both a high 2DEG concentration and high electron (2DEG) mobility and has high operating efficiency. The high electron mobility is achieved by suppressing alloy scattering, reducing crystal defects at the interface of the spacer layer 21 with the electron transit layer $2b$, improving surface smoothness of the spacer layer 21, and the like.

Third Embodiment

This embodiment discloses a structure and a manufacturing method of an InAlN/GaN.HEMT similarly to the first embodiment, but is different from the first embodiment in that the spacer layer is different. Note that the same constituent members and so on as those in the first embodiment will be denoted by the same reference signs, and detailed explanations thereof will be omitted.

Figure 8A:
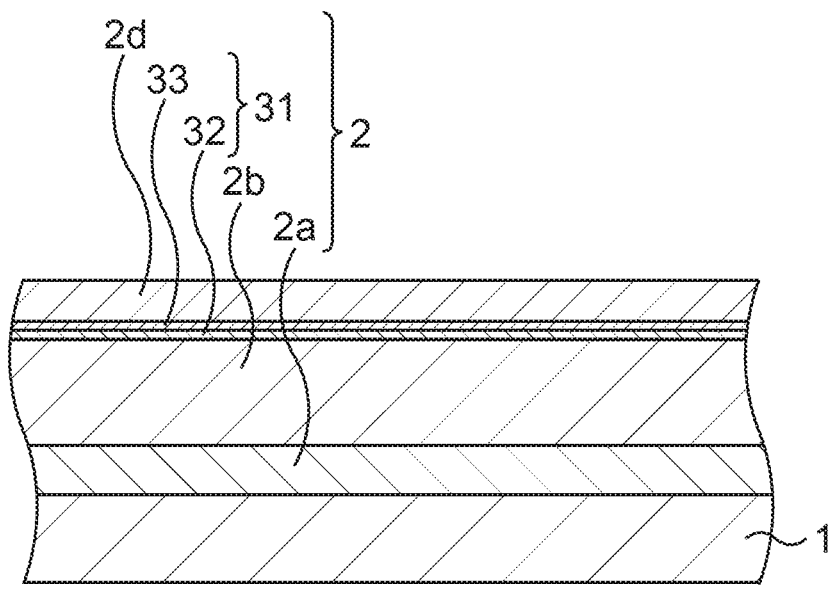
FIG. 8A and FIG. 8B are schematic cross-sectional views each illustrating a principal process of a manufacturing method of an InAlN/GaN.HEMT according to a third embodiment.
Figure 8B:
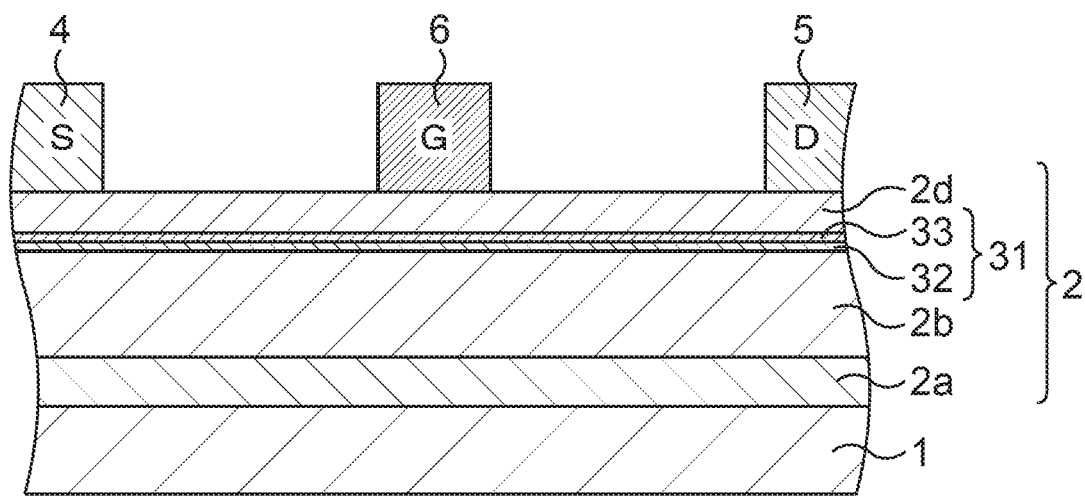

FIG. 8A and FIG. 8B are schematic cross-sectional views each illustrating a principal process of the manufacturing method of the InAlN/GaN.HEMT according to a third embodiment.

In this embodiment, as illustrated in FIG. 8A, the compound semiconductor stacked structure 2 is first formed similarly to the first embodiment, but in place of the spacer layer 2c of AlGaN, a spacer layer 31 is formed. The spacer layer 31 has a stacked structure of a lower layer 32 of InAlGaN and an upper layer 33 of AlGaN and is formed by sequentially growing InAlGaN and AlGaN on i-GaN of the electron transit layer 2b. A growth condition of InAlGaN is that as a source gas, a mixed gas of a TMI gas, a TMA gas, a TMG gas, and an $NH_3$ gas is used. A growth condition of AlGaN is that as a source gas, a mixed gas of a TMA gas, a TMG gas, and an $NH_3$ gas is used. The spacer layer 31 is formed to have a thickness of 2 nm or so to 3 nm or so similarly to the spacer layer 2c. For example, the lower layer 32 and the upper layer 33 are each formed to have a thickness of 1 nm or so.

In the spacer layer 31, InAlGaN of the lower layer 32 is set to $In_xAl_yGa_{1-x-y}N$, and a composition ratio of In is 0.2 or less (0<x≤0.2), for example, 0.05 or so, and a composition ratio of Al is not less than 0.2 nor more than 0.7 (0.2≤y≤0.7) ($In_{0.05}Al_{0.5}Ga_{0.45}N$). AlGaN of the upper layer 33 is set to $Al_xGa_{1-x}N$, and a composition ratio of Al is not less than 0.2 nor more than 0.7 (0.2≤x≤0.7), and is set to, for example, 0.5 or so ($Al_{0.5}Ga_{0.5}N$).

Subsequently, the various processes in FIG. 1B to FIG. 2 are gone through. At this time, as illustrated in FIG. 8B, the source electrode 4, the drain electrode 5, and the gate electrode 6 are formed on the compound semiconductor stacked structure 2.

Thereafter, through processes such as forming an interlayer insulating film, forming wirings connected to the source electrode 4, the drain electrode 5, and the gate electrode 6, forming an upper protective film, forming a connection electrode exposed on the uppermost surface and so on, the InAlN/GaN.HEMT according to this embodiment is formed.

Hereinafter, there will be explained operations and effects exhibited by the InAlN/GaN.HEMT according to this embodiment.

Similarly to the first embodiment, the electron supply layer 2d is formed of InAlN, to thereby create a large difference in spontaneous polarization from GaN of the electron transit layer 2b, resulting in that a high 2DEG concentration can be achieved.

The spacer layer 31 according to this embodiment includes the lower layer 32 made of InAlGaN, and thereby the stress in the interface with GaN of the electron transit layer 2b is decreased. On the lower layer 32, the upper layer 33 made of AlGaN is formed to obtain high surface smoothness. By the spacer layer 31, the stress in the interface with the electron transit layer 2b is kept to the minimum and the interface with the electron supply layer 2d is formed of the layer of AlGaN having high smoothness, resulting in that interface roughness scattering is also suppressed simultaneously. Thereby, the electron (2DEG) mobility improves.

As has been explained above, in this embodiment, there is fabricated the InAlN/GaN.HEMT that satisfies both a high 2DEG concentration and high electron (2DEG) mobility and has high operating efficiency. The high electron mobility is achieved by suppressing alloy scattering, reducing crystal defects at the interface of the spacer layer 31 with the electron transit layer 2b, improving surface smoothness of the spacer layer 31, and the like.

Modified Example

Hereinafter, there will be explained a modified example of the third embodiment. This example discloses a structure and a manufacturing method of an InAlN/GaN.HEMT similarly to the third embodiment, but is different from the third embodiment in that the stacked structure of the spacer layer is different. Note that the same constituent members and so on as those in the third embodiment will be denoted by the same reference signs, and detailed explanations thereof will be omitted.

Figure 9A:
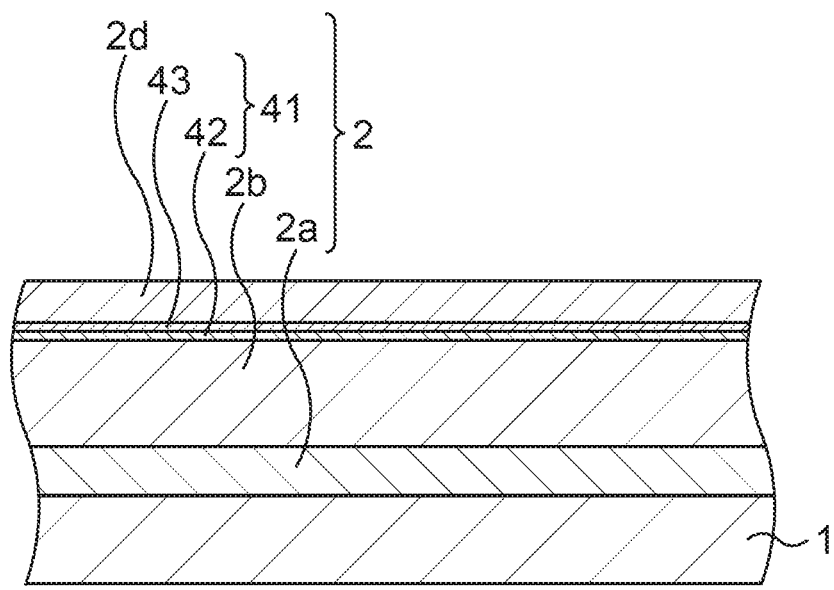
FIG. 9A and FIG. 9B are schematic cross-sectional views each illustrating a principal process of a manufacturing method of an InAlN/GaN.HEMT according to a modified example of the third embodiment.
Figure 9B:
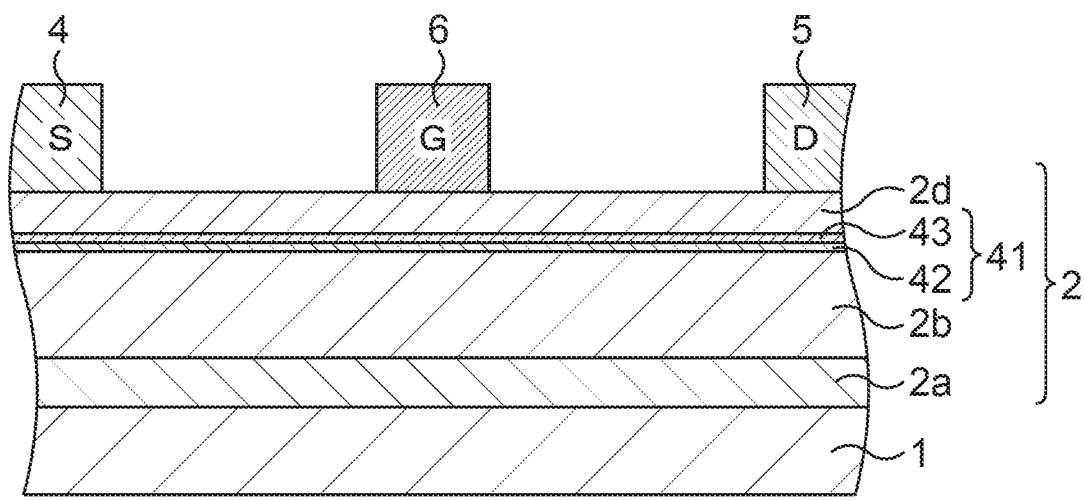

FIG. 9A and FIG. 9B are schematic cross-sectional views each illustrating a principal process of the manufacturing method of the InAlN/GaN.HEMT according to the modified example of the third embodiment.

In this embodiment, as illustrated in FIG. 9A, the compound semiconductor stacked structure 2 is first formed similarly to the third embodiment, but in place of the spacer layer 31 of AlGaN, a spacer layer 41 is formed. The spacer layer 41 has a stacked structure of a lower layer 42 of AlGaN and an upper layer 43 of InAlGaN positioned thereon, which is contrary to the spacer layer 31, and is formed by sequentially growing AlGaN and InAlGaN on i-GaN of the electron transit layer 2b. In the spacer layer 41, for example, the lower layer 42 and the upper layer 43 are each formed to have a thickness of 2 nm or so.

In the spacer layer 41, AlGaN of the lower layer 42 is set to $Al_xGa_{1-x}N$, and a composition ratio of Al is not less than 0.2 nor more than 0.7 (0.2≤x≤0.7), and is set to, for example, 0.7 or so ($Al_{0.7}Ga_{0.3}N$). InAlGaN of the upper layer 43 is set to $In_xAl_yGa_{1-x-y}N$, and a composition ratio of In is 0.2 or less (0<x≤0.2), for example, 0.08 or so. A composition ratio of Al is, for example, 0.72 or so ($In_{0.08}Al_{0.72}Ga_{0.2}N$).

Subsequently, the various processes in FIG. 1B to FIG. 2 are gone through. At this time, as illustrated in FIG. 9B, the source electrode 4, the drain electrode 5, and the gate electrode 6 are formed on the compound semiconductor stacked structure 2.

Thereafter, through processes such as forming an interlayer insulating film, forming wirings connected to the source electrode 4, the drain electrode 5, and the gate electrode 6, forming an upper protective film, forming a connection electrode exposed on the uppermost surface and so on, the InAlN/GaN.HEMT according to this example is formed.

Hereinafter, there will be explained operations and effects exhibited by the InAlN/GaN.HEMT according to this example.

Similarly to the third embodiment, the electron supply layer 2d is formed of InAlN to thereby create a large difference in spontaneous polarization from GaN of the electron transit layer 2b, resulting in that a high 2DEG concentration can be achieved.

The spacer layer 41 of this example includes the lower layer 42 made of AlGaN and the upper layer 43 made of InAlGaN. In this case, AlGaN is formed on GaN of the electron transit layer 2b, and further thereon, InAlGaN is formed. When they are grown by the MOVPE method, a growth temperature needs to be drastically lowered (to 200° C. or so to 300° C. or so) with respect to GaN and AlGaN because an In atom has quite high volatility. Further, nitride semiconductor layers containing In cause a phase separation phenomenon when being exposed to a high-temperature environment, so that it is not possible to increase the substrate temperature up to the growth temperature of GaN and AlGaN after growth. When growing the spacer layer 41, AlGaN of the lower layer 42 can be grown under the high-temperature condition directly after growth of GaN of the electron transit layer 2b and high-quality AlGaN can be formed. As the spacer layer, AlGaN itself results in a form to internally contain tensile crystal distortion due to a difference in lattice constant from GaN. The composition in which the lattice constant of InAlGaN is slightly larger than the lattice constant of GaN is made and InAlGaN of the upper layer 43 is stacked on AlGaN of the lower layer 42, thereby making it possible to provide opposite compressive distortion to AlGaN. AlGaN that is good in quality at high temperature is used for the lower layer 42, and the crystal distortion is cancelled by InAlGaN of the upper layer 43 positioned immediately thereon. Thereby, there is fabricated a high-quality spacer structure in which the crystal distortion is cancelled out. Accordingly, the smooth high-quality spacer layer 41 that internally contains no crystal distortion is fabricated and the electron (2DEG) mobility improves.

As has been explained above, in this embodiment, there is fabricated the InAlN/GaN.HEMT that satisfies both a high 2DEG concentration and high electron (2DEG) mobility and has high operating efficiency. The high electron mobility is achieved by suppressing alloy scattering, reducing crystal defects at the interface of the spacer layer 41 with the electron transit layer 2b, improving surface smoothness of the spacer layer 41, and the like.

Fourth Embodiment

This embodiment discloses a structure and a manufacturing method of an InAlN/GaN.HEMT similarly to the first embodiment, but is different from the first embodiment in that the spacer layer is different. Note that the same constituent members and so on as those in the first embodiment will be denoted by the same reference signs, and detailed explanations thereof will be omitted.

Figure 10A:
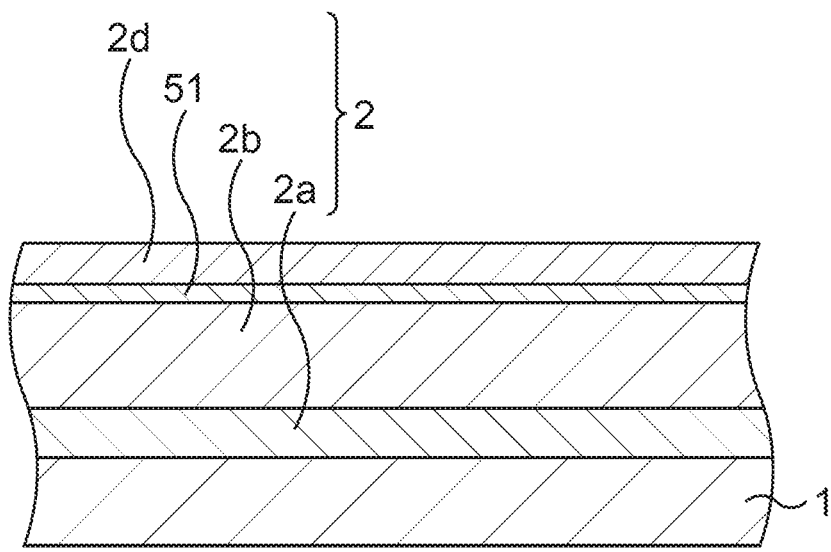
FIG. 10A and FIG. 10B are schematic cross-sectional views each illustrating a principal process of a manufacturing method of an InAlN/GaN.HEMT according to a fourth embodiment.
Figure 10B:
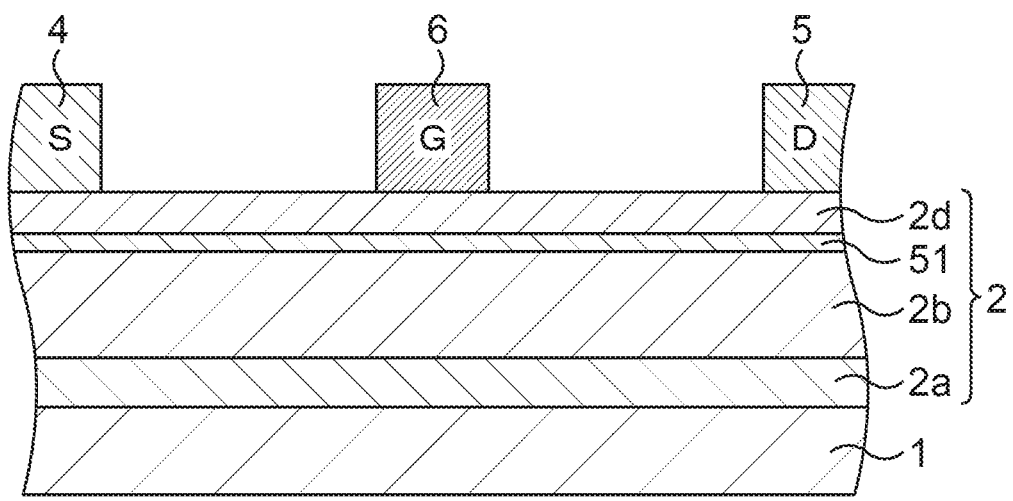

FIG. 10A and FIG. 10B are schematic cross-sectional views each illustrating a principal process of the manufacturing method of the InAlN/GaN.HEMT according to a fourth embodiment.

In this embodiment, as illustrated in FIG. 10A, the compound semiconductor stacked structure 2 is first formed similarly to the first embodiment, but in place of the spacer layer 2c of AlGaN, a spacer layer 51 is formed. The spacer layer 51 is made of AlGaN, and has a composition ratio of Al that increases gradually from a lower surface thereof (a contact surface with the electron transit layer 2b) toward an upper surface thereof (a contact surface with the electron supply layer 2d). The composition ratio of Al is desired to change continuously from the lower surface to the upper surface. The composition ratio of Al may also change stepwise. A growth condition of AlGaN is that as a source gas, a mixed gas of a TMA gas, a TMG gas, and an $NH_3$ gas is used and a flow amount of the TMA gas is gradually increased appropriately. AlGaN of the spacer layer 51 is formed to have a thickness of 2 nm or so to 3 nm or so similarly to AlGaN of the spacer layer 2c.

Incidentally, the spacer layer 51 may also be formed of InAlGaN. In this case as well, the spacer layer 51 has a composition ratio of Al that increases gradually from the lower surface (a contact surface with the electron transit layer 2b) toward the upper surface (a contact surface with the electron supply layer 2d) similarly to the above. The composition ratio of Al is desired to change continuously from the lower surface to the upper surface. The composition ratio of Al may also change stepwise. A growth condition of InAlGaN is that as a source gas, a mixed gas of a TMI gas, a TMA gas, a TMG gas, and an $NH_3$ gas is used and a flow amount of the TMA gas is gradually increased appropriately. InAlGaN of the spacer layer 51 is formed to have a thickness of 2 nm or so to 3 nm or so similarly to InAlGaN of the spacer layer 21.

AlGaN of the spacer layer 51 changes in a manner to make the composition ratio of Al fall within a range of not less than 0.2 nor more than 0.7. For example, AlGaN is $Al_{0.3}Ga_{0.7}N$ at the lower surface, the composition ratio of Al increases gradually as it goes toward the upper surface, and AlGaN becomes $Al_{0.7}Ga_{0.3}N$ at the upper surface.

When the spacer layer 51 is formed of InAlGaN, InAlGaN changes in a manner to make the composition ratio of Al fall within a range of not less than 0.2 nor more than 0.7 and make the composition ratio of In become 0.2 or less respectively. For example, InAlGaN is $In_{0.05}Al_{0.65}Ga_{0.3}N$ at the lower surface, the composition ratio of Al increases gradually as it goes toward the upper surface, and InAlGaN becomes $In_{0.05}Al_{0.7}Ga_{0.25}N$ at the upper surface.

Subsequently, the various processes in FIG. 1B to FIG. 2 are gone through. At this time, as illustrated in FIG. 10B, the source electrode 4, the drain electrode 5, and the gate electrode 6 are formed on the compound semiconductor stacked structure 2.

Thereafter, through processes such as forming an interlayer insulating film, forming wirings connected to the source electrode 4, the drain electrode 5, and the gate electrode 6, forming an upper protective film, forming a connection electrode exposed on the uppermost surface and so on, the InAlN/GaN.HEMT according to this embodiment is formed.

In this embodiment, similarly to the first to third embodiments, there is fabricated the InAlN/GaN.HEMT that satisfies both a high 2DEG concentration and high electron (2DEG) mobility and has high operating efficiency. The high electron mobility is achieved by suppressing alloy scattering, reducing crystal defects at the interface of the spacer layer 51 with the electron transit layer 2b, improving surface smoothness of the spacer layer 51, and the like.

Furthermore, in this embodiment, the following operations and effects are exhibited in addition to the above-described effects.

How smoothly electron transport from the electrodes 4 and 5 to the crystal side is performed becomes important when the source electrode 4 and the drain electrode 5 are formed on the crystal surface of the compound semiconductor stacked structure 2. At this time, when a material having a large band gap exists at a crystal deep portion side of the compound semiconductor stacked structure, when seen from the electrode side, in addition to a barrier being the interface between the electrodes and the electron supply layer, a second barrier exists at the crystal deep portion side. In this case, it becomes difficult to form an ohmic junction.

As for the change in the Al composition of the spacer layer 51 (or InAlGaN), this embodiment is designed to have a composition modulated structure in which a band gap of a material becomes small from an upper surface toward a lower surface. Therefore, there is an advantage that an ohmic junction is likely to be formed. Further, due to the change that the Al composition becomes high toward the upper surface side of the spacer layer 51, a spontaneous polarization electric charge amount of crystal and a piezoelectric polarization electric charge amount also increase monotonously toward the upper surface. Therefore, in the spacer layer 51, an electric field intensity that draws electrons from the electrodes 4 and 5 side toward the 2DEG side is more intensified, which works advantageously to the formation of an ohmic junction. As above, modulation of the Al composition of the spacer layer 51 enables better formation of an ohmic junction.

Modified Example

Hereinafter, there will be explained a modified example of the fourth embodiment. This example discloses a structure and a manufacturing method of an InAlN/GaN.HEMT similarly to the fourth embodiment, but is different in that the compound semiconductor layer with a changeable Al composition is different. Note that the same constituent members and so on as those in the fourth embodiment will be denoted by the same reference signs, and detailed explanations thereof will be omitted.

Figure 11A:
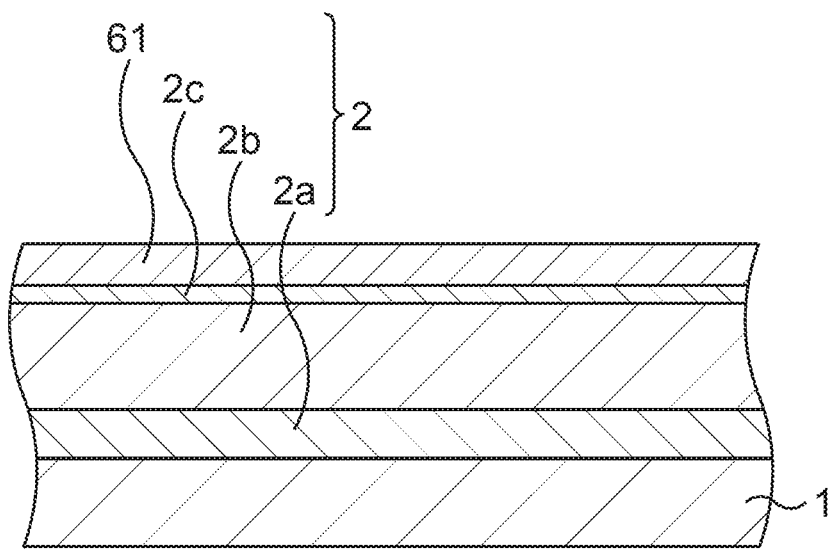
FIG. 11A and FIG. 11B are schematic cross-sectional views each illustrating a principal process of a manufacturing method of an InAlN/GaN.HEMT according to a modified example of the fourth embodiment.
Figure 11B:
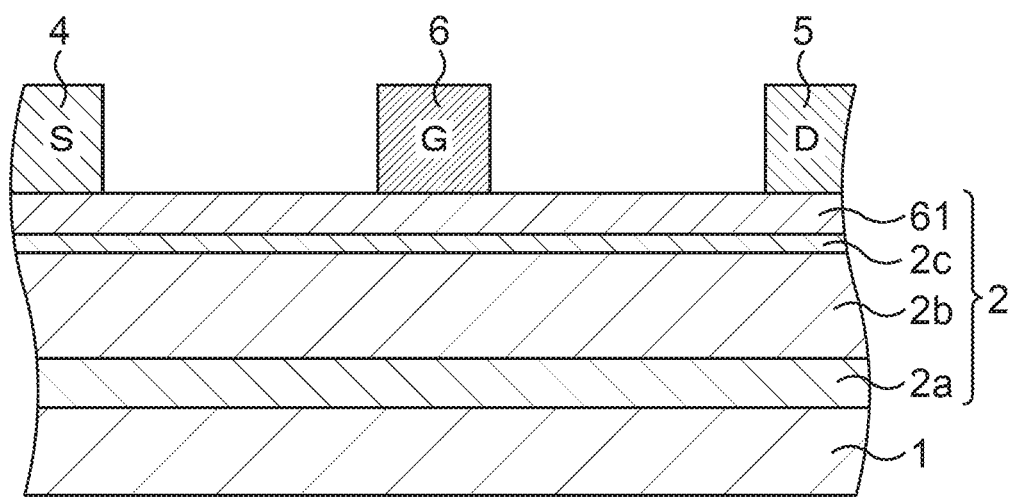

FIG. 11A and FIG. 11B are schematic cross-sectional views each illustrating a principal process of the manufacturing method of the InAlN/GaN.HEMT according to the modified example of the fourth embodiment.

In this embodiment, as illustrated in FIG. 11A, the compound semiconductor stacked structure 2 is first formed similarly to the first embodiment, but in place of the electron supply layer 2d, an electron supply layer 61 is formed. The electron supply layer 61 is made of InAlN, and has a composition ratio of Al that increases gradually from a lower surface thereof (a contact surface with the spacer layer 2s) toward an upper surface thereof (a surface of the compound semiconductor stacked structure 2). The composition ratio of Al is desired to change continuously from the lower surface to the upper surface. The composition ratio of Al may also change stepwise. A growth condition of InAlN is that as a source gas, a mixed gas of a TMA gas, a TMG gas, and an $NH_3$ gas is used and a flow amount of the TMA gas is gradually increased appropriately. InAlN of the electron supply layer 61 is formed to have a thickness of, for example, 10 nm or so similarly to InAlN of the electron supply layer 2d.

In this example, similarly to the first and second embodiments, there is fabricated the InAlN/GaN.HEMT that satisfies both a high 2DEG concentration and high electron (2DEG) mobility and has high operating efficiency. The high electron mobility is achieved by suppressing alloy scattering, reducing crystal defects at the interface of the spacer layer 2c with the electron transit layer 2b, improving surface smoothness of the spacer layer 2c, and the like.

Furthermore, in this embodiment, the following operations and effects are exhibited in addition to the above-described effects.

How smoothly electron transport from the electrodes 4 and 5 to the crystal side is performed becomes important when the source electrode 4 and the drain electrode 5 are formed on the crystal surface of the compound semiconductor stacked structure 2. At this time, when a material having a large band gap exists at a crystal deep portion side of the compound semiconductor stacked structure, when seen from the electrode side, in addition to a barrier being the interface between the electrodes and the electron supply layer, a second barrier exists at the crystal deep portion side. In this case, it becomes difficult to form an ohmic junction.

As for the change in Al composition of the electron supply layer 61, this example is designed to have a composition modulated structure in which a band gap of a material becomes small from an upper surface toward a lower surface. Therefore, there is an advantage that an ohmic junction is likely to be formed. Further, due to the change that the Al composition becomes high toward the upper surface side of the electron supply layer 61, a spontaneous polarization electric charge amount of crystal and a piezoelectric polarization electric charge amount also increase monotonously toward the upper surface. Therefore, in the electron supply layer 61, an electric field intensity that draws electrons from the electrodes 4 and 5 side toward the 2DEG side is more intensified, which works advantageously to the formation of an ohmic junction. As above, modulation of the Al composition of the electron supply layer 61 enables better formation of an ohmic junction.

Incidentally, the third embodiment and its modified example may also be applied in combination. In this case, the compound semiconductor stacked structure 2 is designed to have a structure including both the spacer layer 51 and the electron supply layer 61 (structure including the buffer layer 2a, the electron transit layer 2b, the spacer layer 51, and the electron supply layer 61). This structure enables much better formation of an ohmic junction.

Fifth Embodiment

This embodiment discloses a power supply device including one kind selected from among the InAlN/GaN.HEMTs according to the first to fourth embodiments and the various modified examples.

Figure 12:
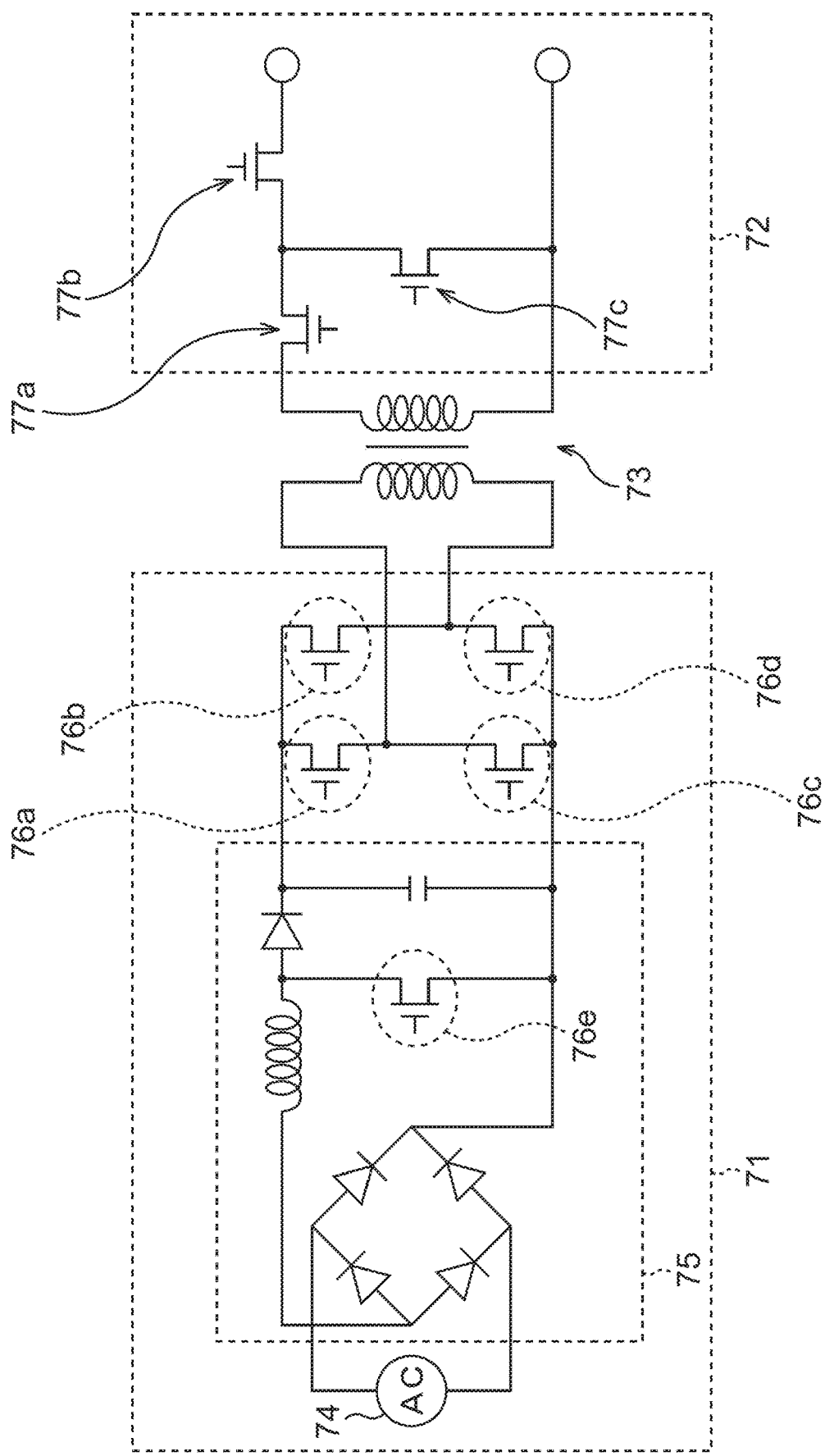
FIG. 12 is a connection diagram illustrating a schematic configuration of a power supply device according to a fifth embodiment.

FIG. 12 is a connection diagram illustrating a schematic configuration of a power supply device according to a fifth embodiment.

The power supply device according to this embodiment is configured by including a high-voltage primary-side circuit 71, a low-voltage secondary-side circuit 72, and a transformer 73 disposed between the primary-side circuit 71 and the secondary-side circuit 72.

The primary-side circuit 71 is configured by including an AC power supply 74, a what is called bridge rectifying circuit 75, and a plurality of (four here) switching elements 76a, 76b, 76c, and 76d. Further, the bridge rectifying circuit 75 has a switching element 76e.

The secondary-side circuit 72 is configured by including a plurality of (three here) switching elements 77a, 77b, and 77c.

In this embodiment, the switching elements 76a, 76b, 76c, 76d, and 76e of the primary-side circuit 71 are each one kind selected from among the InAlN/GaN.HEMTs according to the first to fourth embodiments and the various modified examples. On the other hand, the switching elements 77a, 77b, and 77c of the secondary-side circuit 72 are each an ordinary MIS.FET using silicon.

In this embodiment, the highly reliable high-withstand-voltage InAlN/GaN.HEMT that satisfies both a high 2DEG concentration and high electron (2DEG) mobility is applied to a power supply device. Thereby, a highly reliable large-power power supply device is fabricated.

Sixth Embodiment

This embodiment discloses a high-frequency amplifier including one kind selected from among the InAlN/GaN.HEMTs according to the first to fourth embodiments and the various modified examples.

Figure 13:
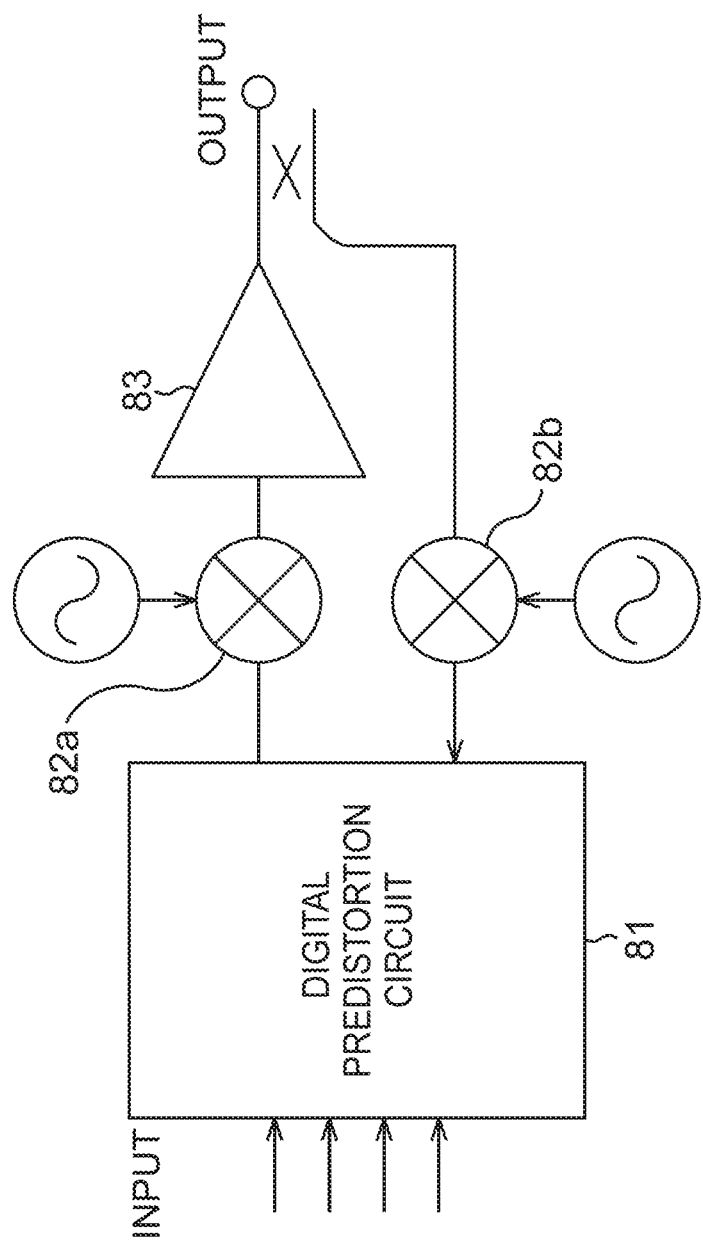
FIG. 13 is a connection diagram illustrating a schematic configuration of a high-frequency amplifier according to a sixth embodiment.

FIG. 13 is a connection diagram illustrating a schematic configuration of a high-frequency amplifier according to a sixth embodiment.

The high-frequency amplifier according to this embodiment is configured by including a digital predistortion circuit 81, mixers 82a and 82b, and a power amplifier 83.

The digital predistortion circuit 81 compensates nonlinear distortion of an input signal. The mixer 82a mixes the input signal whose nonlinear distortion is compensated and an AC signal. The power amplifier 83 amplifies the input signal mixed with the AC signal, and has one kind selected from among the InAlN/GaN.HEMTs according to the first to fourth embodiments and the various modified examples. Incidentally, in FIG. 13, by, for example, changing the switches, an output-side signal can be mixed with the AC signal by the mixer 82*b*, and the resultant can be sent out to the digital predistortion circuit 81.

In this embodiment, the highly reliable high-withstand-voltage InAlN/GaN.HEMT that satisfies both a high 2DEG concentration and high electron (2DEG) mobility is applied to a high-frequency amplifier. Thereby, a highly reliable high-withstand-voltage high-frequency amplifier is fabricated.

Incidentally, the above-described first to six embodiments each disclose a compound semiconductor device in which a carrier is an electron and two-dimensional electron gas (2DEG) is generated in the vicinity of an interface of an electron transit layer with an electron supply layer (precisely a spacer layer), but are not limited to this. For example, the above-described first to six embodiments are each applicable also to a compound semiconductor device in which a carrier is a hole and two-dimensional electron gas (2DEG) is generated in the vicinity of an interface of a hole transit layer with a hole supply layer (precisely a spacer layer).

According to the above-described various aspects, there is fabricated a high operating efficiency compound semiconductor device that satisfies both a high carrier concentration and high carrier mobility. The high carrier mobility is achieved by suppressing alloy scattering, reducing crystal defects at an interface of a spacer layer with a carrier transit layer, and improving surface smoothness of the spacer layer.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
   a carrier transit layer;
   a carrier supply layer that is formed over the carrier transit layer and is made of InAlN; and
   a spacer layer that is formed between the carrier transit layer and the carrier supply layer and has a stacked structure of a layer of InAlGaN contacts with the carrier transit layer and a layer of AlGaN contacts with the carrier supply layer, wherein
   a composition ratio of In of the layer of InAlGaN is not less than 0.05 nor more than 0.2 and
   a composition ratio of Al of the layer of AlGaN is not less than 0.5 nor more than 0.7.

2. The compound semiconductor device according to claim 1, wherein
   a thickness of the spacer layer is not less than 2 nm nor more than 3 nm.

3. A manufacturing method of a compound semiconductor device, comprising:
   forming a carrier transit layer;
   forming, on the carrier transit layer, a spacer layer having a stacked structure of a layer of InAlGaN contacts with the carrier transit layer and a layer of AlGaN on the layer of InAlGaN; and
   forming, on the spacer layer, a carrier supply layer made of InAlN contacts with the layer of AlGaN, wherein
   a composition ratio of In of the layer of InAlGaN is not less than 0.05 nor more than 0.2 and
   a composition ratio of Al of the layer of AlGaN is not less than 0.5 nor more than 0.7.

4. The manufacturing method of the compound semiconductor device according to claim 3, wherein
   a thickness of the spacer layer is not less than 2 nm nor more than 3 nm.

5. A power supply circuit comprising a transformer and a high-voltage circuit and a low-voltage circuit across the transformer,
   the high-voltage circuit comprising a transistor,
   the transistor comprising:
      a carrier transit layer;
      a carrier supply layer that is formed over the carrier transit layer and is made of InAlN; and
      a spacer layer that is formed between the carrier transit layer and the carrier supply layer and has a stacked structure of a layer of InAlGaN contacts with the carrier transit layer and a layer of AlGaN contacts with the carrier supply layer, wherein
   a composition ratio of In of the layer of InAlGaN is not less than 0.05 nor more than 0.2 and
   a composition ratio of Al of the layer of AlGaN is not less than 0.5 nor more than 0.7.

6. A high-frequency amplifier that amplifies an input high-frequency voltage and outputs a resultant high-frequency voltage, the high-frequency amplifier comprising:
   a transistor,
   the transistor comprising:
      a carrier transit layer;
      a carrier supply layer that is formed a over the carrier transit layer and is made of InAlN; and
      a spacer layer that is formed between the carrier transit layer and the carrier supply layer and has a stacked structure of a layer of InAlGaN contacts with the carrier transit layer and a layer of AlGaN contacts with the carrier supply layer, wherein
   a composition ratio of In of the layer of InAlGaN is not less than 0.05 nor more than 0.2 and
   a composition ratio of Al of the layer of AlGaN is not less than 0.5 nor more than 0.7.

* * * * *